United States Patent [19]

Eshima et al.

[11] Patent Number: 4,885,837
[45] Date of Patent: Dec. 12, 1989

[54] APPARATUS FOR FORMING LEADS OF SEMICONDUCTOR DEVICES

[75] Inventors: Taizo Eshima; Kunihiro Yasutake; Katuhiko Yamasaki, all of Fukuoka, Japan

[73] Assignee: Mitsubishi Denki Kabushiki Kaisha, Japan

[21] Appl. No.: 284,724

[22] Filed: Dec. 15, 1988

[30] Foreign Application Priority Data

Jan. 13, 1988 [JP]  Japan .................................... 63-6105
Jun. 20, 1988 [JP]  Japan .................................. 63-153093

[51] Int. Cl.⁴ ............................................. B23P 23/00
[52] U.S. Cl. ...................................... 29/564; 29/827; 174/52.6; 437/220
[58] Field of Search .................. 437/220, 217; 29/827, 29/564; 174/52.6

[56] References Cited

U.S. PATENT DOCUMENTS

| | | | |
|---|---|---|---|
| 3,899,305 | 8/1975 | Hilgers et al. | 29/827 X |
| 3,981,074 | 9/1976 | Yamamoto et al. | 437/217 |
| 4,592,131 | 6/1986 | Deie | 174/52.5 X |
| 4,627,159 | 12/1986 | Waldner | 29/827 |

FOREIGN PATENT DOCUMENTS

| | | | |
|---|---|---|---|
| 55-72045 | 5/1980 | Japan | 437/220 |
| 56-83052 | 7/1981 | Japan | 29/827 |
| 60-173847 | 9/1985 | Japan | 437/220 |
| 62-219951 | 9/1987 | Japan | 29/882 |

*Primary Examiner*—Howard N. Goldberg
*Assistant Examiner*—Carl J. Arbes
*Attorney, Agent, or Firm*—Leydig, Voit & Mayer

[57] ABSTRACT

An apparatus for forming leads of semiconductor devices includes a tie-bar cutting device for cutting tie-bars connecting adjacent leads in a lead frame on which semiconductor chips are mounted and which has unwanted resin burrs as a result of resin-sealing, a resin-burr removing device for removing resin burrs from the lead frame whose tie-bars have been cut, and a bending device for bending the leads of the lead frame whose resin burrs have been removed. After tie-bars are cut from a lead frame on which semiconductor chips are mounted, resin burrs are removed from the lead frame and the leads of the lead frame are bent.

14 Claims, 6 Drawing Sheets

APPARATUS FOR FORMING LEADS OF SEMICONDUCTOR DEVICES

BACKGROUND OF THE INVENTION

1. Field of the Invention

This invention rlates to an apparatus and a method for forming the leads of semiconductor devices utilized in manufacturing semiconductor devices.

2. Description of the Related Art

Figure 1:
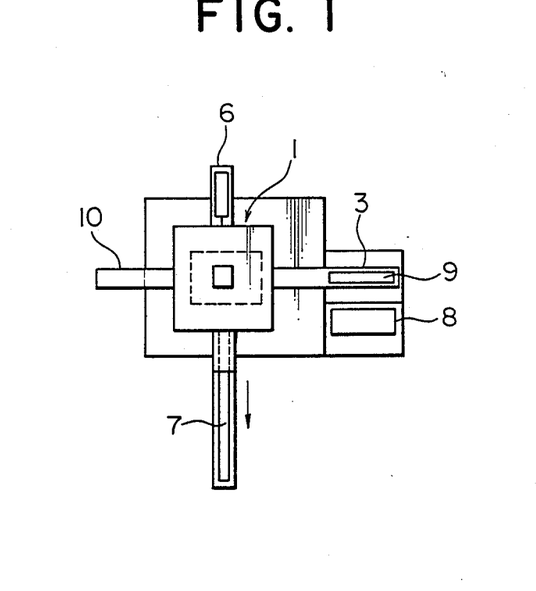
FIGS. 1 and 2 are a plan view and a side view, respectively, of a conventional lead forming apparatus.
Figure 2:
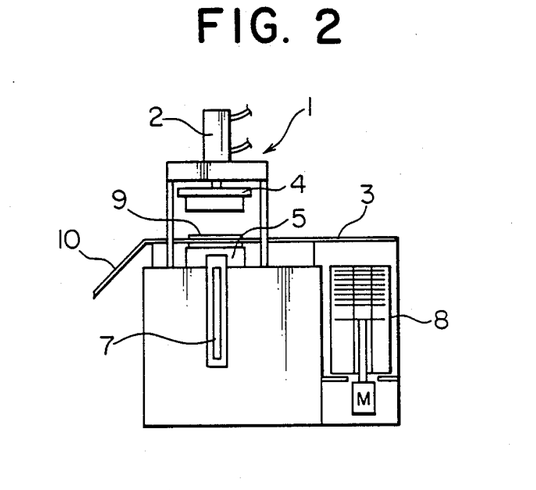

FIG. 1 shows a conventional lead-forming device, which includes a press 1. Connected to this press 1 are a conveying rail 3 for conveying lead frames 9, a discharge cylinder 6 for discharging from the press 1 the products formed therein, a product storage section 7 for storing the products discharged from the press 1, and a discharge chute 10 for discharging the remnants of lead frames left over from punching of the products. Arranged beside the conveying rail 3 is a magazine 8 for storing a multitude of lead frames 9 for lead forming. Semiconductor chips (not shown) are mounted on these lead frames 9 and resin-sealed. As shown in FIG. 2, the press 1 includes a mold composed of an upper mold half 4 and a lower mold half 5, and a hydraulic cylinder 2.

The operation of this conventional device will now be described. After the resin-sealed lead frame 9 is taken out of the magazine 8, it is conveyed along the conveying rail 3 and is set on the lower mold half 5. The hydraulic cylinder 2 then causes the upper mold half 4 to be lowered so that the leads of the lead frame 9 may be formed, i.e., the tie-bars connecting the adjacent leads may be cut and the leads bent. The semiconductor device thus formed is discharged from the press 1 by the discharge cylinder 6 and stored in the product storage section 7, the remnants of the lead frame 9 being discharged through the discharge chute 10.

It is to be noted, however, that the resin-sealing of the semiconductor chips on the lead frame 9 normally involves the generation of resin burrs between the adjacent leads. If the lead frame 9 having these resin burrs were lead-formed as it is, the resin would be punched into the leads, resulting in poor contact of the latter. It is consequently necessary to remove the resin burrs from between the leads of the lead frames, which increases the number of manufacturing processes.

SUMMARY OF THE INVENTION

This invention aims at eliminating these problems. It is accordingly the object of this invention to provide an apparatus and a method for forming leads of semiconductor devices which are capable of reducing the number of manufacturing processes as well as of preventing inadequate lead contacts.

In accordance with this invention, there is provided an apparatus for forming leads of semiconductor devices comprising a tie-bar cutting device for cutting tie-bars connecting the adjacent leads of a lead frame on which semiconductor chips are mounted and which has unwanted resin burrs as a result of resin-sealing, a resin-burr removing device for removing resin burrs from the lead frame whose tie-bars have been cut by means of said tie-bar cutting device, and a lead bending device for bending the leads of a lead frame whose resin burrs have been removed by means of said resin-burr removing device.

The method of forming leads for semiconductor devices in accordance with this invention comprises the steps of cutting tie-bars connecting the adjacent leads of a lead frame on which semiconductor chips are mounted and which has resin burrs as a result of resin-sealing, removing resin burrs from the lead frame, and bending the leads of the lead frame.

DESCRIPTION OF THE PREFERRED EMBODIMENTS

Embodiments of this invention will now be described with reference to the attached drawings.

Figure 3:
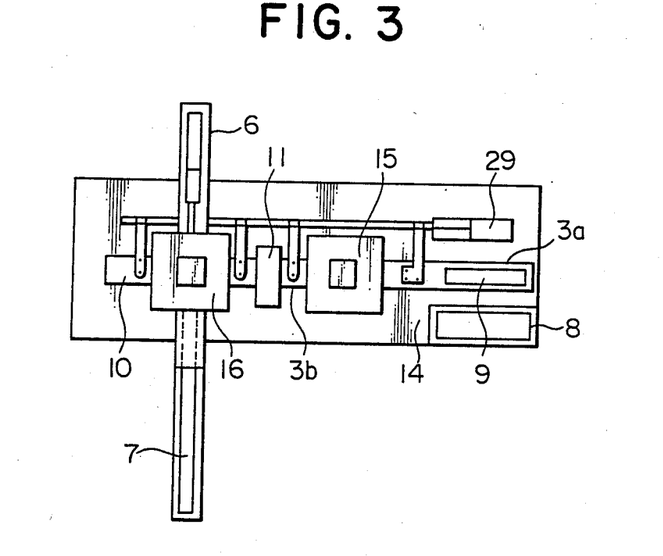
FIGS. 3 and 4 are a plan view and a side view, rerspectively, of a lead forming apparatus in accordance with a first embodiment of this invention.

FIGS. 3 to 8 show a lead forming apparatus in accordance with the first embodiment of this invention. As shown in FIG. 3, a tie-bar cutting press 15 is provided on a base 14. The ends of first and second conveying rails 3a and 3b are connected to either end portion of the tie-bar cutting press 15 in such a manner that they are aligned in a straight line. A lead bending press 16 which is fixed to the base 14 is connected to another end of the second conveying rail 3b. A cleaning device 11, situated over and beside the second conveying rail 3b, is arranged between these presses 15 and 16. Connected to the lead bending press 16 are a discharge cylinder 6 for discharging from the press 16 the products formed therein, a product storage section 7 for storing the products discharged from the press 16, and a discharge chute 10 for discharging the remnants of lead frames left over by punching out the products. A magazine 8 for storing a multitude of lead frames 9 for lead forming is arranged beside another end of the first conveying rail 3a. Semiconductor chips (not shown) are mounted on these lead frames 9 and resin-sealed. Further, arranged beside the first and second conveying rails 3a and 3b in parallel relation therewith is a conveying cylinder 29 for conveying leead frames.

Figure 4:
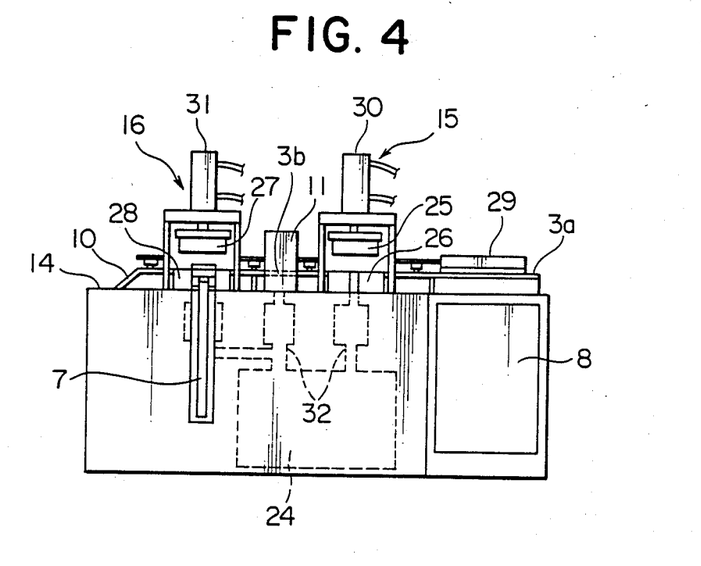

As shown in FIG. 4, the tie-bar cutting press 15 includes a mold which is composed of an upper mold half 25 and a lower mold half 26, and a hydraulic cylinder 30 for pressing the upper mold half 25 against the lower mold half 26. The lead bending press 16 likewise includes an upper mold half 27, a lower mold half 28, and a hydraulic cylinder 31 for pressing the upper mold half 27 against the lower mold half 28. Provided below the base 14 is a dust collector 24, which is connected to the lower mold half 26 of the tie-bar cutting press 15, to the cleaning device 11, and to the lower mold half 28 of the lead bending press 16, through ducts 32.

Figure 5:
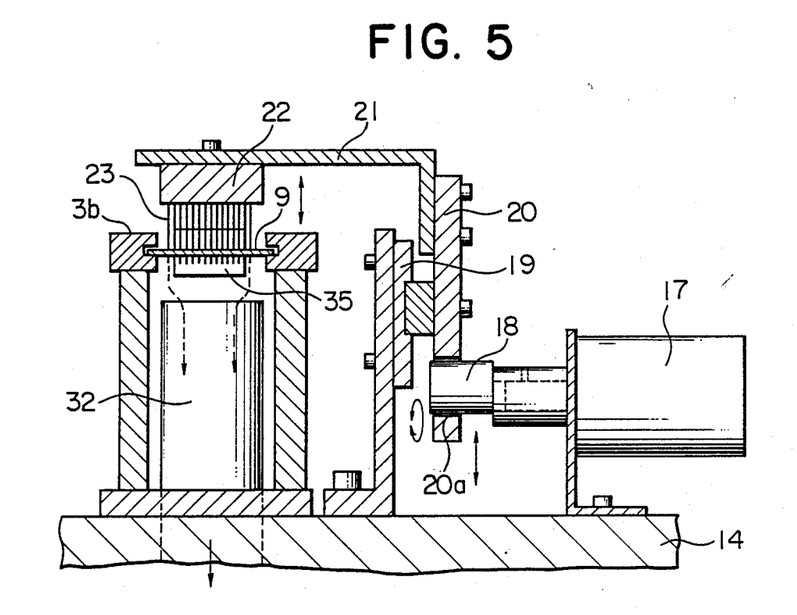
FIG. 5 is a sectional view showing a cleaning device used in the first embodiment of this invention.

As shown in FIG. 5, the cleaning device 11 includes a slide bearing 19 fixed to the base 14, and a movable plate 20 which is vertically movable with respect to the slide bearing 19. Connected to this movable plate 20 is a horizontally extending oscillating plate 21 whose end portion is positioned above the second conveying rail 3b, a holder 22 being connected to the lower side of the end portion of the oscillating plate 21. Further, a brush 23 for cleaning lead frames is held by this holder 22.

Figure 6:
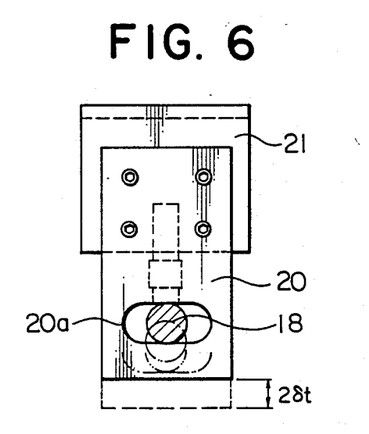
FIGS. 6 and 7 are a front view and a perspective view, respectively, showing a component of the cleaning device of FIG. 5.
Figure 7:
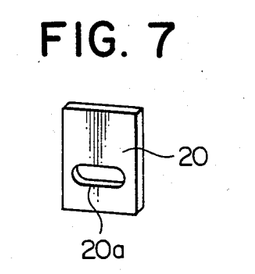
Figure 8:
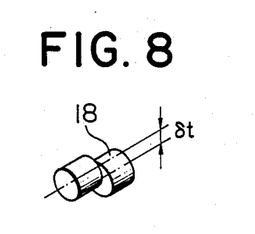
FIG. 8 is a perspective view showing another component of the cleaning device of FIG. 5.

As shown in FIGS. 6 and 7, the movable plate 20 includes a horizontally elongated throughhole 20a, which is penetrated, as shown in FIG. 8, by an eccentric shaft 18 in the form of a crank shaft with an eccentricity δt. As shown in FIG. 5, this eccentric shaft 18 is connected to the rotational shaft of a motor 17. When the eccentric shaft 18 is rotated by the motor 17, the movable plate 20 makes a vertical movement with a stroke of 2δt, as shown in FIG. 6.

Figure 9:
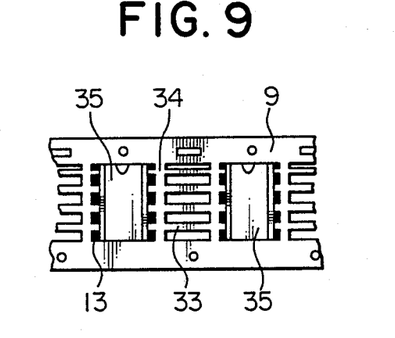
FIGS. 9 and 10 are plan views showing a lead frame before and after cutting the tie-bars thereof, respectively.
Figure 10:
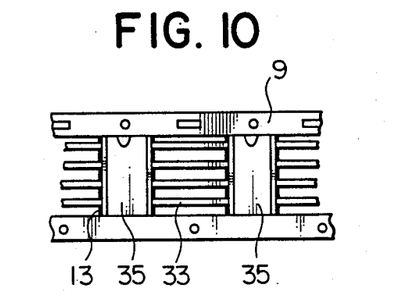

Next, the operation of this embodiment will be described. First, the lead frame 9 is taken out of the magazine 8 and placed on the first conveying rail 3a. As shown in FIG. 9, the lead frame 9 has a multitude of leads 33, tie-bars 34 connecting adjacent leads 33, and packages 35 in which semiconductor chips (not shown) are resin-sealed. There exist resin burrs 13 in the spaces between the leads which are located around the packages 35. This lead frame 9 is conveyed along the first conveying rail 3a to the tie-bar cutting press 15 by the conveying cylinder 29, and is set on the lower mold half 26. Subsequently, the hydraulic cylinder 30 is operated to move the upper mold half 25 of the tie-bar cutting press 15 downwardly, thereby cutting the tie-bars 34 of the lead frame 9, as shown in FIG. 10. At this stage, there still exist resin burrs in the portions around the packages 35.

Figure 11:
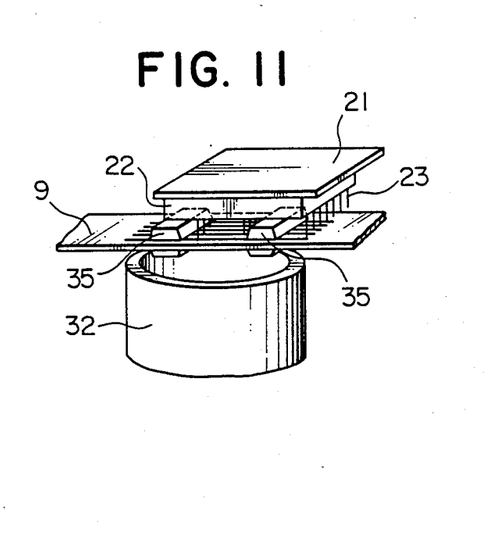
FIGS. 11 and 12 are a perspective view and a sectional view, respectively, showing the operation of the cleaning device of FIG. 5.
Figure 12:
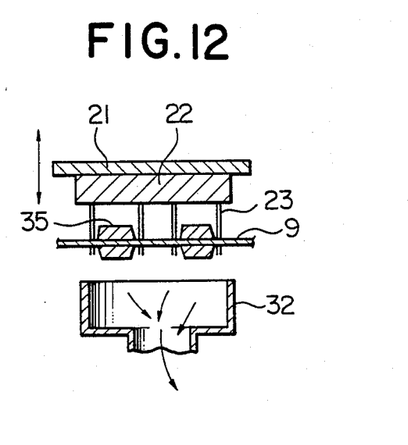

The the lead frame 9 is then conveyed along second conveying rail 3b by the conveying cylinder 29, and is stopped at a position where the packages 35 come immediately under the brush 23 of the cleaning device 11, as shown in FIG. 11. In this state, the motor 17 is driven to rotate the eccentric shaft 18 so that the movable plate 20 is forced to move vertically together with the oscillating plate 21, the holder 22 and the brush 23. As a result, as shown in Fig. 12, the brush 23 is repeatedly moved into and out of contact with the portions around the packages 35 of the lead frame 9, thereby brushing off the resin burrs 13 from the lead frame 9. The resin burrs 13 thus brushed off are sucked under vacuum into the dust collector 24 through the ducts 32.

Figure 13:
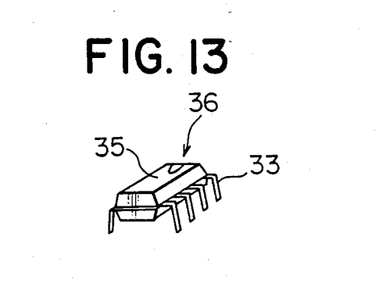
FIG. 13 is a perspective view showing a lead-formed semiconductor device.

The lead frame 9 with the resin burrs 13 thus removed is further conveyed along the second conveying rail 3b to the lead bending press 16 by the conveying cylinder 29, and is set on the lower mold half 28. Subsequently, the hydraulic cylinder 31 is operated to cause the upper mold half 27 of the lead bending press 16 to descend, thereby cutting off packages 35 and the leads 33 from the lead frame 9. At the same time, the upper mold half 27 bends the leads 33 so as to form the semiconductor devices 36 as shown in FIG. 13.

Thereafter, these semiconductor devices 36 are discharged from the lead bending press 16 by the discharge cylinder 6, and are stored as products in the product storage section 7. The remnants of the lead frame 9 resulting from punching out of the semiconductor devices 36 are discharged through the discharge chute 10 by the conveying cylinder 29.

In this way, the semiconductor devices 36 can be manufactured without punching the resin burrs 13 in the leads 33.

While in the above-described first embodiment the vertical movement of the brush 23 is effected with the motor 17 and the eccentric shaft 18, means for vertically moving the brush 23 are not restricted to that embodiment. For example, a linear motor may be employed for this purpose. Further, by effecting the vertical movement of the brush 23 with a period corresponding to the forming cycles of the tie-bar cutting press 15 and the lead bending press 16, a plurality of lead frames 9 can be processed successively and smoothly.

Figure 14:
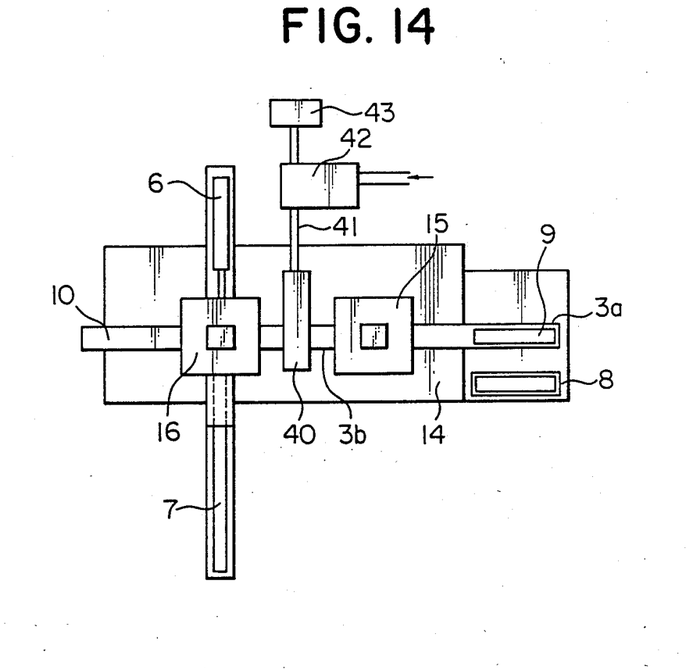
FIGS. 14 and 15 are a plan view and a side view, respectively, of a lead forming device in accordance with a second embodiment of this invention.
Figure 15:
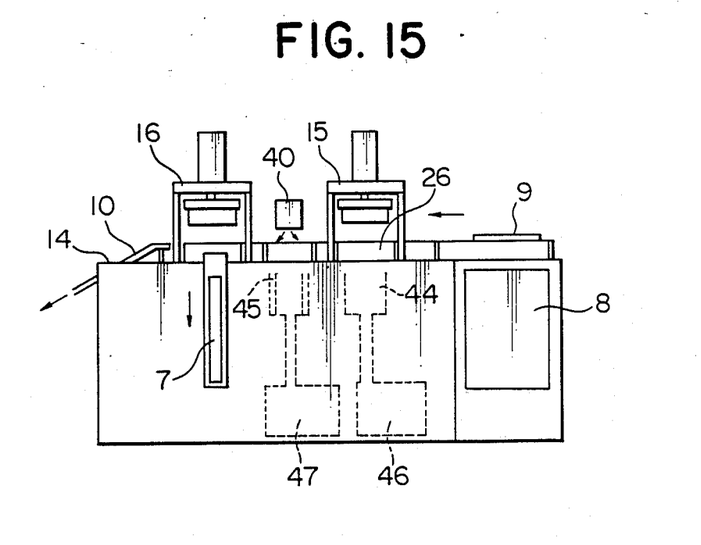

FIG. 14 and 15 show a lead forming apparatus in accordance with the second embodiment of this invention. In this apparatus, the resin burrs 13 are removed by blowing air on the lead frame 9, instead of using the brush 23. As shown in FIG. 14, an air nozzle 40 is arranged at a position between the tie-bar cutting press 15 and the lead bending press 16 and above the second conveying rail 3b. An ion generator 42 is connected to this air nozzle 40 through an air supply pipe 41. A dry-air supplying device (not shown) is connected to this ion generator 42. Further, a power source 43 for generating ions is connected to the ion generator 42. As shown in FIG. 15, ducts 44 and 45 are disposed in the tie-bar cutting press 15 with their open ends located at positions near the second conveying rail 3b and directly under the air nozzle 40, respectively. These ducts 44 and 45 are connected at their other end to respective dust collectors 46 and 47 arranged below the base 14. As for the other components, an explanation thereof will be omitted since they are identical with those of the first embodiment shown in FIGS. 3 and 4. Further, to simplify the drawings, the conveying cylinder 29 is omitted in FIGS. 14 and 15.

Figure 16:
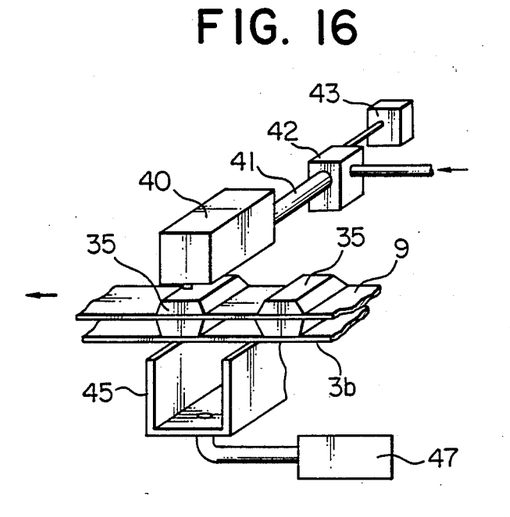
FIG. 16 is a perspective view showing the essential part of the second embodiment of this invention.

The operation of this second embodiment will now be described. As in the first embodiment, the lead frame 9 is taken out of the magazine 8, and is conveyed along the first conveying rail 3a to the tie-bar cutting press 15, where the operation of cutting the tie-bars is performed. Subsequently, the lead frame 9 is conveyed along the second conveying rail 3b to the lead bending press 16. When, as shown in FIG. 16, the packages 35 pass directly under the air nozzle 40, dry air is supplied from the dry-air supplying device (not shown) to the ion generator 42, where it is ionized and is blown on the lead frame 9 through the air supply pipe 41 and the air nozzle 40. This causes the resin burrs 13 to be removed from the lead frame 9. The burrs 13 thus removed are then sucked in the dust collector 47 through the duct 45.

Thereafter, the lead frame 9 is conveyed to the lead bending press 16, where the operations of detaching the packages 35 and the leads 33 from the lead frame 9 and of bending the lead frames 33 are performed, as in the first embodiment, resulting in the semiconductor devices 36 as shown in FIG. 13.

Here, it is to be noted that the resin burrs 13 can be removed by blowing non-ionized dry air on the lead frame 9 through the air nozzle 40 without the ion generator 42 and the power source 43. When, however, ionized air is blown on the lead frame 9, as described above, the removal of the burrs 13 becomes more effective since static electricity can then be removed from the lead frame 9.

Further, a common dust collector may be provided as in the first embodiment, instead of providing separate dust collectors 46 and 47.

Figure 17:
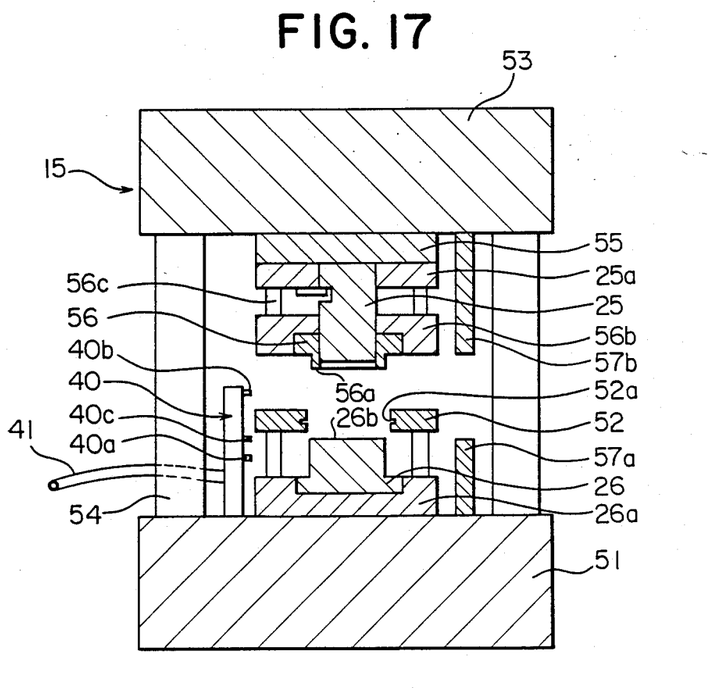
FIG. 17 is a sectional view showing the essential part of a third embodiment of this invention.

While in the above second embodiment the air nozzle 40 is disposed between the tie-bar cutting press 15 and the lead bending press 16, it may be disposed in the tie-bar cutting press 15, as shown in FIG. 17. In the embodiment shown in FIG. 17, the lower mold half 26 such as a die is fixed to a lower die set 51 through an intermediate die holder 26a.

This die 26 includes a recess (not shown) on an upper surface 26b thereof having a predetermined configuration for forming the leads 33 of the lead frame 9. This embodiment includes guide rails 52 for conveying the lead frame 9 to the die 26. These guide rails 52 are provided in parallel, with their grooves 52a opposed to each other, and are connected to the first and second conveying rails 3a and 3b. This embodiment further includes an upper die set 53 for supporting upper mold half 25 such as a punch and pressing it against the above-mentioned die 26. This upper die set 53 can move vertically with respect to the lower die set 51, and is connected to a pressing device (not shown) for the purpose of pressing the punch 25 against the die 26. Formed at the lower end of the punch 25 is a pressing surface (not shown) having approximately the same configuration as the die 26. The upper end of the punch 25 is fixed to the upper die set 53 through an intermediate punch holder 25a and a backing plate 55. Reference numeral 56 indicates a stripper for pressing the lead frame 9 against the die 26 and fixing the lead frame 9 thereto. This stripper 56 has at its lower end a stripper surface 56a for abutment against the upper surface of the lead frame 9. Stripper 56 is attached to the upper die set 53 through a stripper holder 56b and guide pins 56c so that it can move back and forth with respect to the upper die set 53. 57a and 57b are stoppers for restricting the lowest position of the upper die set 53. These stoppers 57a and 57b are provided on the lower and upper die sets 51 and 53, respectively, with their end surfaces opposed to each other. In other words, the upper die set 53 can descend until these stoppers 57a and 57b abut against each other.

An air nozzle 40 is arranged upright on the lower die set 51. This air nozzle 40 includes a blowout opening 40a for blowing air on the upper surface 26b of the die 26, and a pair of blowout openings 40b, 40c for blowing air on either surface of the lead frame 9. Further, an air supplying device (not shown) is connected to the air nozzle 40 through an air supply pipe 41.

In operation, the lead frame 9 is conveyed along the guide rails 52 to the die 26, where it is positioned with the die 26 and a package 35 opposed to each other. Subsequently, the stripper 56 is pressed against the leads 33 of the lead frame 9 by lowering the upper die set 53, the lead frame 9 being held between the stripper surface 56a of the stripper 56 and the upper surface 26b of the die 26.

The upper die set 53 is then further lowered, thereby causing the lower end of the punch 25 to protrude downward from the stripper surface 56a. During this process, the punch 25 cuts the tie-bars 34 of the lead frame 9. After that, the upper die set 53 is raised to separate the punch 25 from the lead frame 9. In this state, air is supplied from the air supplying device (not shown) to the air nozzle 40 through the air supply pipe 41 so that it is blown onto the upper surface 26b of the die 26 as well as on the upper and lower surfaces of the lead frame 9, thereby blowing away foreign materials thereon such as the resin burrs 13.

The lead frame 9 from which the resin burrs have been thus removed is conveyed to the lead bending press 16, where the operation of bending the leads 33 is performed.

The air may be ionized before being jetted through the air nozzle 40 in the tie-bar cutting press 15, as in the second embodiment.

When it is possible to sufficiently remove the resin burrs 13 from the lead frame 9, before cutting off the tie-bars 34, by blowing air from the air nozzle 40 provided in the press 15, the tie-bar cutting press 15 and the lead bending press 16 need not be separated from each other. In this case, the die 26 and the punch 25 in FIG. 17 will cut the tie-bars 34 and bend leads 33 at the same time. First, air is blown through the air nozzle 40 onto the upper and lower surfaces of the lead frame 9 as well as onto the upper surface 26b of the die 26, thereby removing the resin burrs 13 from the lead frame 9. The upper die set 53 is then lowered to perform the cutting of the tie-bars 34 and the bending of the leads 33. This prevents the resin burrs 13 from being punched into the leads 33.

What is claimed is:

1. An apparatus for forming the leads of resin-sealed semiconductor devices comprising:
    tie-bar cutting means comprising a first press for cutting tie-bars connecting adjacent leads of a lead frame on which semiconductor chips are mounted and which has unwanted resin burrs as a result of resin-sealing of the semi-conductor chips;
    resin-burr removing means for removing the resin burrs from the lead frame whose tie-bars have been cut by said tie-bar cutting means, said resin-burr removing means comprising a brush and moving means for moving said brush relative to said lead frame to brush the resin burrs from the lead frame; and
    bending means comprising a second press for bending the leads of the lead frame whose resin burrs have been removed by means of said resin-burr removing means.

2. An apparatus as claimed in claim 1 wherein said moving means includes means for reciprocatingly moving said brush into and out of contact with the lead frame.

3. An apparatus for forming the leads of resin-sealed semiconductor devices comprising:
    tie-bar cutting means comprising a first press for cutting tie-bars connecting adjacent leads of a lead frame on which semiconductor chips are mounted and which has unwanted resin burrs as a result of resin-sealing of the semiconductor chips;
    resin-burr removing means for removing the resin burrs from the lead frame whose tie-bars have been cut by saiid tie-bar cutting means, wherein said resin-burr removing means includes means for blowing air at the lead frame for removing burrs; and
    bending means comprising a second press for bending the leads of the lead frame whose resin burrs have been removed by means of said resin-burr removing means.

4. An apparatus as claimed in claim 3 wherein said resin-burr removing means comprises an air nozzle and air supply means for blowing air through said air nozzle.

5. An apparatus as claimed in claim 4 wherein said air nozzle is disposed between said first and second presses.

6. An apparatus as claimed in claim 4 wherein said air nozzle is disposed in said first press.

7. An apparatus as claimed in claim 3 including means for ionizing the air blown at said lead frame.

8. An apparatus as claimed in claim 7 wherein said resin-burr removing means comprises an air nozzle and air supply means for blowing air through said air nozzle.

9. An apparatus as claimed in claim 8 wherein said air nozzle is disposed between said first and second presses.

10. An apparatus as claimed in claim 8 wherein said air nozzle is disposed in said first press.

11. An apparatus as claimed in claim 1 comprising dust collecting means for collecting the resin burrs removed from the lead frame by means of said resin-burr removing means.

12. An apparatus as claimed in claim 3 comprising dust collecting means for collecting the resin burrs removed from the lead frame by said resin-burr removing means.

13. An apparatus for forming the leads of resin-sealed semiconductor devices comprising:
    tie-bar cutting means for cutting tie-bars connecting adjacent leads of a lead frame on which semiconductor chips are mounted and which has unwanted resin burrs as a result of resin-sealing of the semiconductor chips;
    resin-burr removing means for removing the resin burrs from the lead frame whose tie-bars have been cut by said tie-bar cutting means, said resin-burr removing means comprising a brush and moving means for moving said brush relative to said lead frame to brush the resin burrs from the lead frame; and
    bending means for bending the leads of the lead frame whose resin burrs have been removed by means of said resin-burr removing means.

14. An apparatus for forming the leads of resin-sesaled semiconductor devices comprising:
    tie-bar cutting means for cutting tie-bars connecting adjacent leads of a lead frame on which semiconductor chips are mounted and which has unwanted resin burrs as a result of resin-sealing of the semiconductor chips;
    resin-burr removing means for removing the resin burrs from the lead frame whose tie-bars have been cut by said tie-bar cutting means, wherein said resin-burr removing means includes means for blowing air at the lead frame for removing burrs; and
    bending means for bending the leads of the lead frame whose resin burrs have been removed by means of said resin-burr removing means.

* * * * *